United States Patent
Young et al.

(10) Patent No.: US 11,217,722 B2
(45) Date of Patent: Jan. 4, 2022

(54) HYBRID GROWTH METHOD FOR III-NITRIDE TUNNEL JUNCTION DEVICES

(71) Applicant: The Regents of the University of California, Oakland, CA (US)

(72) Inventors: Erin C. Young, Santa Barbara, CA (US); Benjamin P. Yonkee, Goleta, CA (US); John T. Leonard, San Jose, CA (US); Tal Margalith, Santa Barbara, CA (US); James S. Speck, Santa Barbara, CA (US); Steven P. DenBaars, Goleta, CA (US); Shuji Nakamura, Santa Barbara, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/743,023

(22) PCT Filed: Jul. 11, 2016

(86) PCT No.: PCT/US2016/041744
§ 371 (c)(1),
(2) Date: Jan. 9, 2018

(87) PCT Pub. No.: WO2017/011387
PCT Pub. Date: Jan. 19, 2017

(65) Prior Publication Data
US 2019/0074404 A1   Mar. 7, 2019

Related U.S. Application Data

(60) Provisional application No. 62/190,929, filed on Jul. 10, 2015.

(51) Int. Cl.
*H01L 21/02* (2006.01)
*H01L 33/00* (2010.01)
(Continued)

(52) U.S. Cl.
CPC ........ *H01L 33/0075* (2013.01); *C30B 23/025* (2013.01); *C30B 25/20* (2013.01);
(Continued)

(58) Field of Classification Search
CPC .................................................. H01L 21/0254
See application file for complete search history.

(56) References Cited

U.S. PATENT DOCUMENTS 4,780,746 A * 10/1988 Naramore .............. B65H 27/00
271/274
4,780,748 A * 10/1988 Cunningham .... H01L 21/02395
257/24

(Continued)

FOREIGN PATENT DOCUMENTS

| EP | 1403935 | 3/2004 |
|---|---|---|
| WO | 2004061923 | 7/2004 |
| WO | 2015/093335 | 6/2015 |

OTHER PUBLICATIONS

Rodney Pezel, Acoparison of MOVPE and MBE Growth Technologies for III-V Epitaxila Structure, May 13, 2013; CS MANTECH Conference; pp. 105-108 (Year: 2013).*
(Continued)

*Primary Examiner* — Moazzam Hossain
*Assistant Examiner* — Hajar Kolahdouzan
(74) *Attorney, Agent, or Firm* — Gates & Cooper LLP

(57) ABSTRACT

A hybrid growth method for III-nitride tunnel junction devices uses metal-organic chemical vapor deposition (MOCVD) to grow one or more light-emitting or light-absorbing structures and ammonia-assisted or plasma-assisted molecular beam epitaxy (MBE) to grow one or more tunnel junctions. Unlike p-type gallium nitride (p-GaN) grown by MOCVD, p-GaN grown by MBE is conductive as grown, which allows for its use in a tunnel junction. Moreover, the doping limits of MBE materials are higher than
(Continued)

MOCVD materials. The tunnel junctions can be used to incorporate multiple active regions into a single device. In addition, n-type GaN (n-GaN) can be used as a current spreading layer on both sides of the device, eliminating the need for a transparent conductive oxide (TCO) layer or a silver (Au) mirror.

20 Claims, 15 Drawing Sheets

(51) Int. Cl.

| | |
|---|---|
| H01L 33/32 | (2010.01) |
| H01L 33/14 | (2010.01) |
| H01L 21/00 | (2006.01) |
| H01L 31/0304 | (2006.01) |
| C30B 23/02 | (2006.01) |
| C30B 29/68 | (2006.01) |
| H01S 5/40 | (2006.01) |
| C30B 25/20 | (2006.01) |
| H01L 33/04 | (2010.01) |
| C30B 29/40 | (2006.01) |
| H01S 5/30 | (2006.01) |
| H01L 31/147 | (2006.01) |
| H01L 33/06 | (2010.01) |
| H01S 5/026 | (2006.01) |
| H01S 5/183 | (2006.01) |
| H01S 5/343 | (2006.01) |

(52) U.S. Cl.
CPC ............ *C30B 29/406* (2013.01); *C30B 29/68* (2013.01); *H01L 21/00* (2013.01); *H01L 21/0254* (2013.01); *H01L 21/0262* (2013.01); *H01L 21/02458* (2013.01); *H01L 21/02505* (2013.01); *H01L 21/02631* (2013.01); *H01L 31/03044* (2013.01); *H01L 31/147* (2013.01); *H01L 33/04* (2013.01); *H01L 33/06* (2013.01); *H01L 33/14* (2013.01); *H01L 33/32* (2013.01); *H01S 5/3095* (2013.01); *H01S 5/4043* (2013.01); *H01S 5/0262* (2013.01); *H01S 5/183* (2013.01); *H01S 5/34333* (2013.01); *Y02E 10/544* (2013.01)

(56) References Cited

U.S. PATENT DOCUMENTS

| | | | |
|---|---|---|---|
| 4,989,050 A * | 1/1991 | Gaw | H01L 33/0025 257/13 |
| 5,960,024 A * | 9/1999 | Li | H01S 5/1057 372/50.11 |
| 6,489,175 B1 | 12/2002 | Jiang et al. | |
| 6,489,179 B2 | 12/2002 | Jiang et al. | |
| 6,515,308 B1 | 2/2003 | Kneissl et al. | |
| 6,526,083 B1 * | 2/2003 | Kneissl | B82Y 20/00 372/50.22 |
| 6,615,308 B1 * | 9/2003 | Fanning | G06F 13/28 710/35 |
| 6,724,013 B2 | 4/2004 | Kneissl et al. | |
| 6,760,357 B1 | 7/2004 | Boucart et al. | |
| 7,123,638 B2 | 10/2006 | Leary et al. | |
| 7,323,721 B2 * | 1/2008 | Liao | B82Y 20/00 257/90 |
| 8,334,157 B2 | 12/2012 | Smeeton et al. | |
| 2001/0040905 A1 * | 11/2001 | Stamm | G01J 1/58 372/32 |
| 2003/0006429 A1 | 1/2003 | Takahashi et al. | |
| 2004/0124435 A1 * | 7/2004 | D'Evelyn | C30B 29/403 257/103 |
| 2010/0224860 A1 * | 9/2010 | Ibbetson | H01L 33/04 257/13 |
| 2011/0150020 A1 * | 6/2011 | Haase | B82Y 20/00 372/45.012 |
| 2013/0270514 A1 | 10/2013 | Saxler | |
| 2015/0037965 A1 | 2/2015 | Beach et al. | |
| 2015/0179872 A1 * | 6/2015 | Zhang | H01L 33/28 257/43 |

OTHER PUBLICATIONS

Sriram Krishnamoorthy et al., InGaN/GaN tunnel junctions for hole injection in GaN light emitting diodes, 2014, Applied physics letters (Year: 2014).*
PCT International Search Report and Written Opinion dated Sep. 27, 2016 for PCT Application No. PCT/US2016/041744.
Pelzel, R., "A Comparison of MOVPE and MBE Growth Technologies for III-V Epitaxial Structures", CS MANTECH Conference, May 13-16, 2013, New Orleans, Louisiana, USA, pp. 105-108.
European Examination Report dated Apr. 9, 2020 for European Patent Appln No. 16824990.2.
Iga, K., "Vertical-Cavity Surface-Emitting Laser: Its Conception and Evolution", Japanese Journal of Applied Physics, 2008, pp. 1-10, vol. 47, No. 1.
Iga, K., "Surface-Emitting Laser—Its Birth and Generation of New Optoelectronics Field", IEEE Journal on Selected Topics in Quantum Electronics, Nov./Dec. 2000, vol. 6, No. 6, pp. 1201-1215.
Feezell, D., "The Evolving GaN VCSEL", Compound Semiconductor, 2014, https://compoundsemiconductor.net/article/91717-the-evolving-gan-vcsel.html as downloaded Oct. 30, 2018.
Krishnamoorthy, S, et al., "InGaN/GaN Tunnel Junctions For Hole Injection in GaN Light Emitting Diodes", Applied Physics Letters, Mar. 2014, pp. 1-17, vol. 105, No. 14.
Simon, J., et al. "Polarization-Induced Hole Doping in Wide-Band-Gap Uniaxial Semiconductor Heterostructures", Science, Jan. 1, 2010, vol. 327, pp. 60-64.
Krishnamoorthy, S., et al., "GdN Nanoisland-Based GaN Tunnel Junctions", Nano Letters, 2013, pp. 2570-2575, vol. 13.
Feezell, D., "Status and future of GaN-based vertical-cavity surface-emitting lasers", Proc of SPIE, 2015, p. 93631G-1-93631G-13.
Esaki, L., "New Phenomenon in Narrow Germanium p-n Junctions", Physical Review, Jan. 15, 1958, pp. 603-604, vol. 109, No. 2.
Krishnamoorthy et al., "III-nitride tunnel junctions for efficient solid state lighting", Visual Communications and Image Processing Conf Jan. 20, 2004 San Jose,, vol. 8986, Mar. 7, 2014 (Mar. 7, 2014), p. 39861F-89861F.
Krishnamoorthy et al., "InGaN/GaN tunnel junctions for hole injection in GaN light emitting diodes", Appl Phys Lett, vol. 105, No. 14, Oct. 6, 2014, p. 141104-1-141104-4.
Extended European Search Report dated Jan. 29, 2019 for EP application No. EP16824990.2.

* cited by examiner

HYBRID GROWTH METHOD FOR III-NITRIDE TUNNEL JUNCTION DEVICES

CROSS REFERENCE TO RELATED APPLICATION

This application claims the benefit under 35 U.S.C Section 119(e) of the following co-pending and commonly-assigned application:

U.S. Provisional Application Ser. No. 62/190,929, filed on Jul. 10, 2015, by Erin C. Young, Benjamin P. Yonkee, John T. Leonard, Tal Margalith, James S. Speck, Steven P. Den-Baars, and Shuji Nakamura, entitled "HYBRID GROWTH METHOD FOR III-NITRIDE TUNNEL JUNCTION DEVICES," attorneys' docket number 30794.588-US-P1 (2015-904-1);

which application is incorporated by reference herein.

BACKGROUND OF THE INVENTION

1. Field of the Invention

This invention relates to a hybrid growth method for III-nitride tunnel junction devices.

2. Description of the Related Art (Note: This application references a number of different publications as indicated throughout the specification by one or more reference numbers in brackets, e.g., [x]. A list of these different publications ordered according to these reference numbers can be found below in the section entitled "References." Each of these publications is incorporated by reference herein.)

A number of techniques have been used for improving the performance of semipolar III-nitride optoelectronic devices. The term "III-nitride" refers to any alloy composition of the (Al,Ga,In,B) N semiconductors having the formula $Al_wGa_xIn_yB_zN$, where $0 \leq w \leq 1$, $0 \leq x \leq 1$, $0 \leq y \leq 1$, $0 \leq z \leq 1$, and $w+x+y+z=1$. The term "semipolar" refers generally to any plane of the III-nitride crystal that is not a polar or nonpolar plane, and more specifically, to any plane that has at least two nonzero h, i, or k Miller indices and a nonzero l Miller index, such as the 20-21 plane.

Current commercially-available III-nitride light-emitting diodes (LEDs), vertical cavity surface emitting lasers (VCSELs), and edge-emitting laser diodes (EELDs), use an active region in a biased p-n junction to allow for electron and hole injection. However, p-type gallium nitride (p-GaN) is difficult to contact electrically, and has low hole concentration and mobility. This means that p-GaN cannot be used as a current spreading layer and that traditional p-contacts will add significant voltage to devices. Despite these inherent problems, all commercial light emitting devices utilize traditional p-contacts and materials other than p-GaN for current spreading, which typically comprise transparent conducting oxides (TCO), such as indium tin oxide (ITO).

A low resistance tunnel junction on top of p-GaN would allow for current spreading in n-type GaN (n-GaN) on both sides of the device, as well as the use of low resistance n-type contacts on both sides of the device. A tunnel junction is a diode comprised of a very highly doped ($n^+/p^+$) interface that allows for electrons to tunnel between the valence band and conduction band. This was first demonstrated by Esaki [1] in highly-doped Ge homojunctions with very thin depletion regions.

In principle, a highly doped Esaki-type homojunction diode should provide the lowest-loss tunnel junction. However, there have been a number of difficulties in achieving high quality tunnel junctions in the GaN material system.

For example, GaN is a wide bandgap semiconductor, so the barrier for tunneling is high. Several approaches to reducing the tunneling barrier have been attempted, including bandgap engineering via polarization (AlN interlayers) [2], reducing the bandgap with an InGaN interlayer [3], and introducing defect states via interfacial GdN nanoparticles [4]. However, all of these approaches are associated with losses, either in terms of voltage or resistance increases, or optical losses in the final device performance.

In another example, magnesium (Mg) doped p-GaN grown by metal-organic chemical vapor deposition (MOCVD) is compensated by hydrogen as grown, and it must be annealed after growth to remove the hydrogen. This anneal can only work if the p-GaN is not covered by n-GaN, as hydrogen cannot easily diffuse through n-GaN. This limits the effectiveness of tunnel junctions and prevents their widespread use.

Thus, there is a need in the art for structure for improving the performance of III-nitride devices. The present invention satisfies this need.

SUMMARY OF THE INVENTION

To overcome the limitations in the prior art described above, and to overcome other limitations that will become apparent upon reading and understanding this specification, the present invention discloses a hybrid growth method for III-nitride tunnel junction devices, wherein MOCVD, which may be plasma MOCVD, is used to grow one or more light-emitting or light-absorbing structures, and ammonia-assisted or plasma-assisted molecular beam epitaxy (MBE) is used to grow one or more tunnel junctions. Unlike p-GaN grown by MOCVD, p-GaN grown by MBE is conductive as grown, which would allow for its use in a tunnel junction. Additionally, the doping limits of MBE materials are higher than MOCVD materials, which allows for better tunnel junctions. By combining MOCVD grown light emitters or absorbers and MBE grown tunnel junctions, the operating voltage of these devices could be reduced and their efficiency could be increased, as well as enabling new types of device structures, including new types of LEDs, VCSELs, EELDs, and solar cells. For example, the tunnel junctions could be used to incorporate multiple active regions into a single device, which could increase performance of EELDs and VCSELs by providing additional gain, or reduce the droop in LEDs by achieving more light at the same current density. In addition, n-type GaN (n-GaN) can be used as a current spreading layer on both sides of the device, eliminating the need for a TCO layer or a silver (Au) minor. The use of low resistance n-contacts on both sides of the device would be especially useful for lasers where the main resistance comes from the p-contacts.

BRIEF DESCRIPTION OF THE DRAWINGS

Referring now to the drawings in which like reference numbers represent corresponding parts throughout:

FIG. 2F is a graph of intensity vs. wavelength that compares the spectra of the devices of FIGS. 2B, 2C and 2D for the three different operating cases at 20 mA.

DETAILED DESCRIPTION OF THE INVENTION

In the following description of the preferred embodiment, reference is made to a specific embodiment in which the invention may be practiced. It is to be understood that other embodiments may be utilized and structural changes may be made without departing from the scope of the present invention.

Overview

As noted above, the present invention comprises a hybrid growth method for III-nitride tunnel junction devices that uses MOCVD to grow one or more light-emitting or light-absorbing structures and MBE is used to grow one or more tunnel junctions.

Epitaxial Structures

Figure 1A:
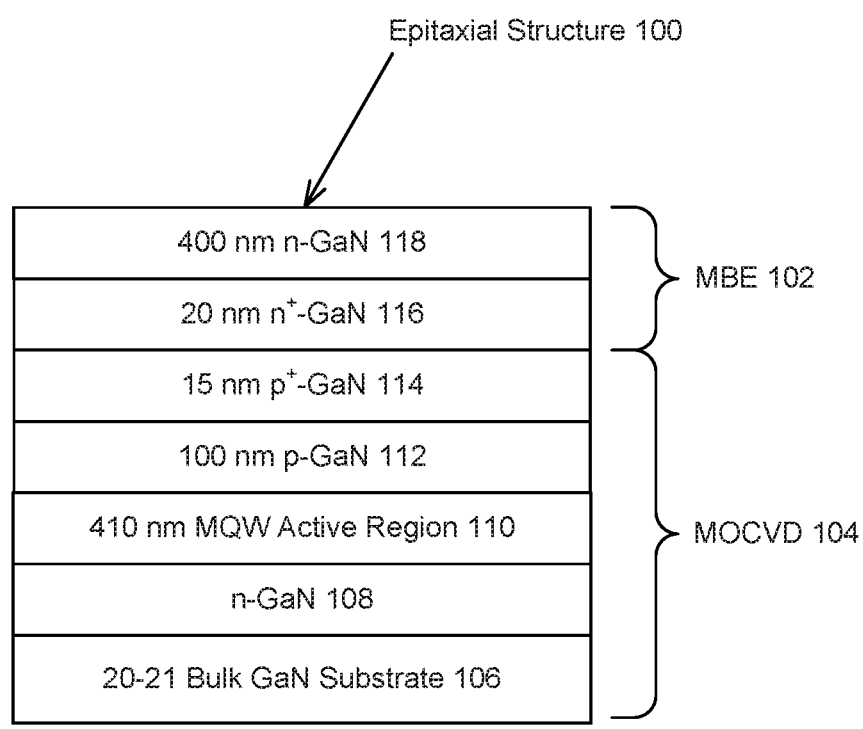
FIG. 1A is a schematic of an epitaxial structure for an MBE tunnel junction grown on an MOCVD LED, wherein the layers of the structure are annotated by the MBE or MOCVD growth technique to the right of the layers.

To demonstrate the tunnel junction design according to the present invention, 410 nm emitting LEDs were grown by MOCVD on 20-21 bulk GaN substrates with a 15 nm p⁺-GaN cap as the final layer. The epitaxial structure 100 is shown in FIG. 1A, which illustrates an MBE tunnel junction grown on an MOCVD LED, wherein the layers of the structure 100 are annotated by their respective MBE 102 or MOCVD 104 growth technique to the right of the layers 106-118. The MOCVD 104 grown LED includes a 20-21 bulk GaN substrate 106, an n-GaN layer 108, a 410 nm multi-quantum well (MQW) active region 110, a 100 nm p-GaN layer 112 and a ~15 nm p⁺-GaN layer 114. An ammonia MBE 102 regrowth was then carried out, which included a ~20 nm n⁺-GaN layer 116 followed by a 400 nm n-GaN layer 118 for current spreading. The regrowth interface between the ~15 nm p⁺-GaN layer 114 and the ~20 nm n⁺-GaN layer 116 serves as the p-n interface in the tunnel junction.

Thereafter, a mesa etch was performed (not shown) on the samples to expose the bottom n-GaN layer 108, as well as isolate the top n-GaN layer 118 from the rest of the substrate 106. A 30/500 nm Ti/Au n-contact layer (not shown) was then deposited using electron beam evaporation on the top and bottom n-GaN layers 118 and 108. The use of two n-contacts can reduce the processing complexity of LEDs by utilizing a single n-contact deposition. The top n-contact was patterned into a probing pad and a thin strip which utilized the top n-GaN layer 118 for current spreading.

Figure 1D:
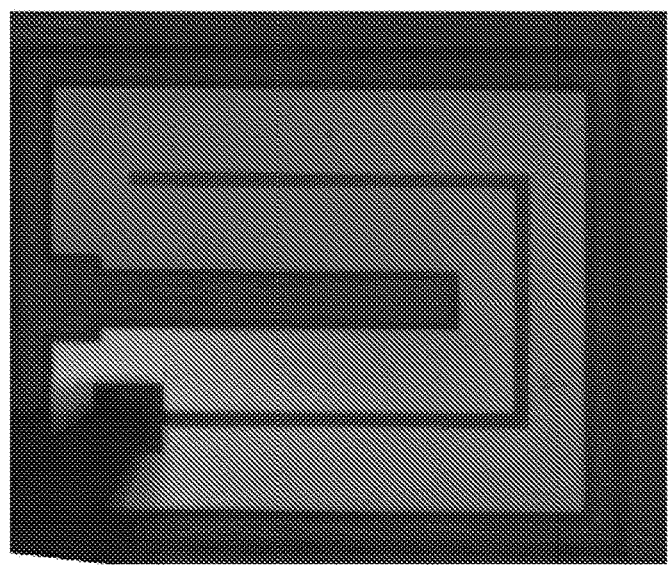
FIG. 1D is an image that shows a standard LED without the tunnel junction with a thin Pd/Au current spreading layer.
Figure 1C:
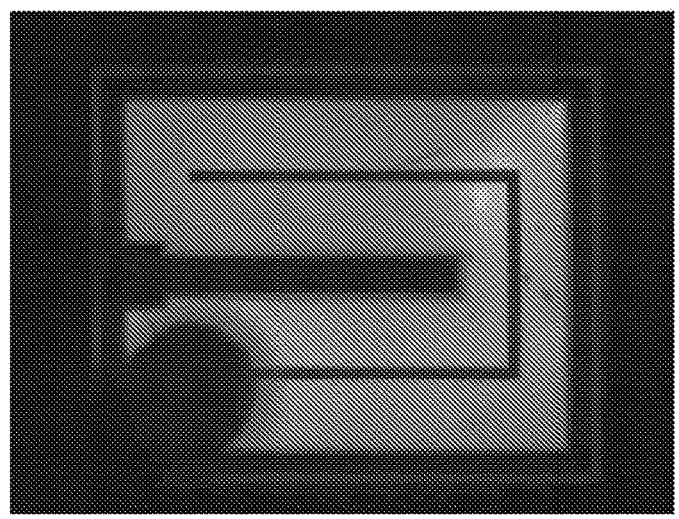
FIG. 1C is an image that shows the device of FIG. 1B under a 20 mA injection current, which corresponds to a current density of 20 A/cm².
Figure 1B:
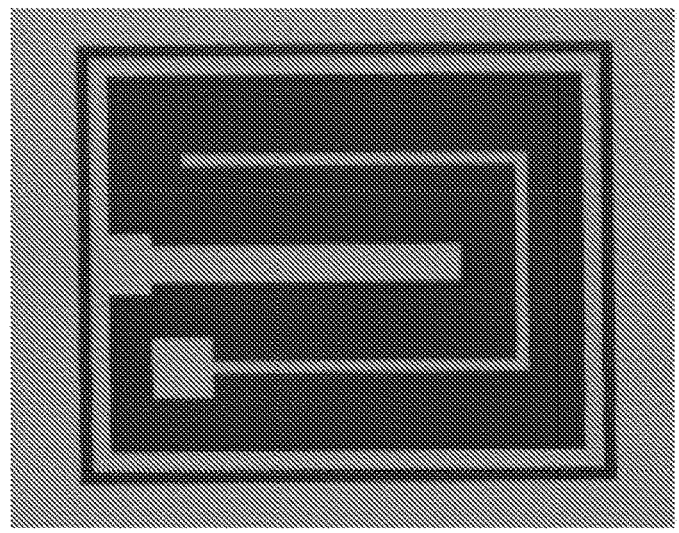
FIG. 1B is an image that shows a simple device with an etched mesa and Ti/Au n-contacts deposited on the top and bottom of the mesa.

An image of a sample device with an etched mesa and Ti/Au n-contacts deposited on the top and bottom of the mesa is shown in FIG. 1B. FIG. 1C is an image of the device of FIG. 1B under a 20 mA injection current, which corresponds to a current density of 20 A/cm².

A standard LED without a tunnel junction, used as a reference LED, was processed in a similar geometry, but without the tunnel junction, and the same mesa etch was performed on the reference LED. A 2/3 nm Pd/Au p-contact layer was put down on top of the mesa. The same Ti/Au metal stack and pattern was used. The Ti/Au on the top of the mesa served as a probing pad and assisted the current spreading in the p-contact. An image of the standard LED without the tunnel junction and with a thin Pd/Au current spreading layer is shown in FIG. 1D.

Figure 1F:
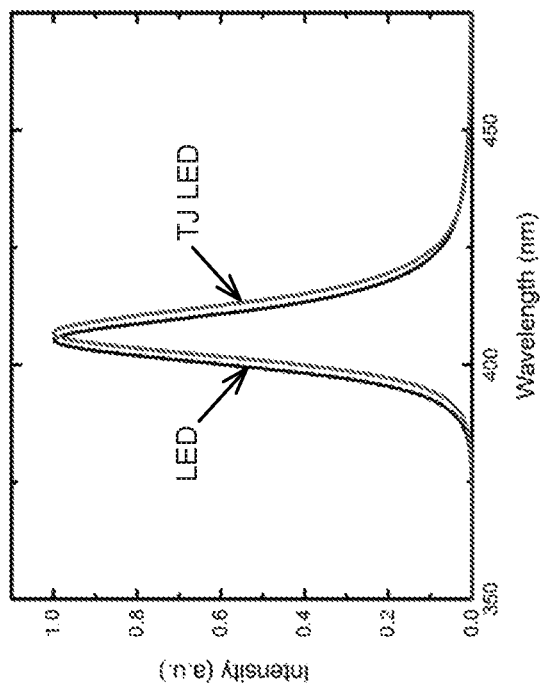
FIG. 1F is a graph of intensity vs. wavelength that compares the spectra of the TJ LED of FIG. 1B to the standard LED of FIG. 1D at a current density of 20 A/cm².
Figure 1E:
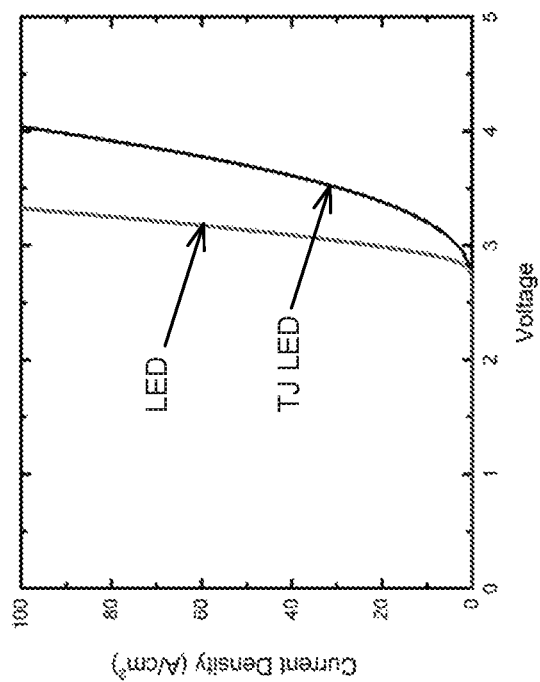
FIG. 1E is a graph of current density vs. voltage (JV) that compares the standard LED of FIG. 1D to the tunnel junction (TJ) LED of FIG. 1B.

FIG. 1E is a graph of current density (A/cm²) vs. voltage that compares the standard LED of FIG. 1D to the TJ LED of FIG. 1B; and FIG. 1F is a graph of intensity (a.u.) vs. wavelength (nm) that compares the spectra of the TJ LED of FIG. 1B to the standard LED of FIG. 1D at a current density of 20 A/cm$^2$. In both devices, the active area is 0.1 mm$^2$. The IV curve of FIG. 1E shows a slightly higher operating voltage for the tunnel junction, but that could be due to the small n-contact and the n-GaN not being thick enough. The spectra of FIG. 1F is nearly identical, except for the slight wavelength variation, which illustrates the effectiveness of the tunnel junction hole injection into the p-GaN.

Tunnel junctions grown by MOCVD are difficult to achieve, because the as-grown Mg-doped layers are insulating due to hydrogen passivation, and are typically activated by a post growth anneal. If a tunnel junction is grown by MOCVD, the p-GaN cannot be activated, because hydrogen will not diffuse through the top n-GaN layer. By using ammonia MBE to grow the n-GaN layer on top, the p-GaN remains activated while being buried beneath the n-GaN. This could allow for the regrowth of a second LED by MOCVD on top of the first LED, because the hydrogen cannot diffuse through the top n-GaN layer.

Figure 2A:
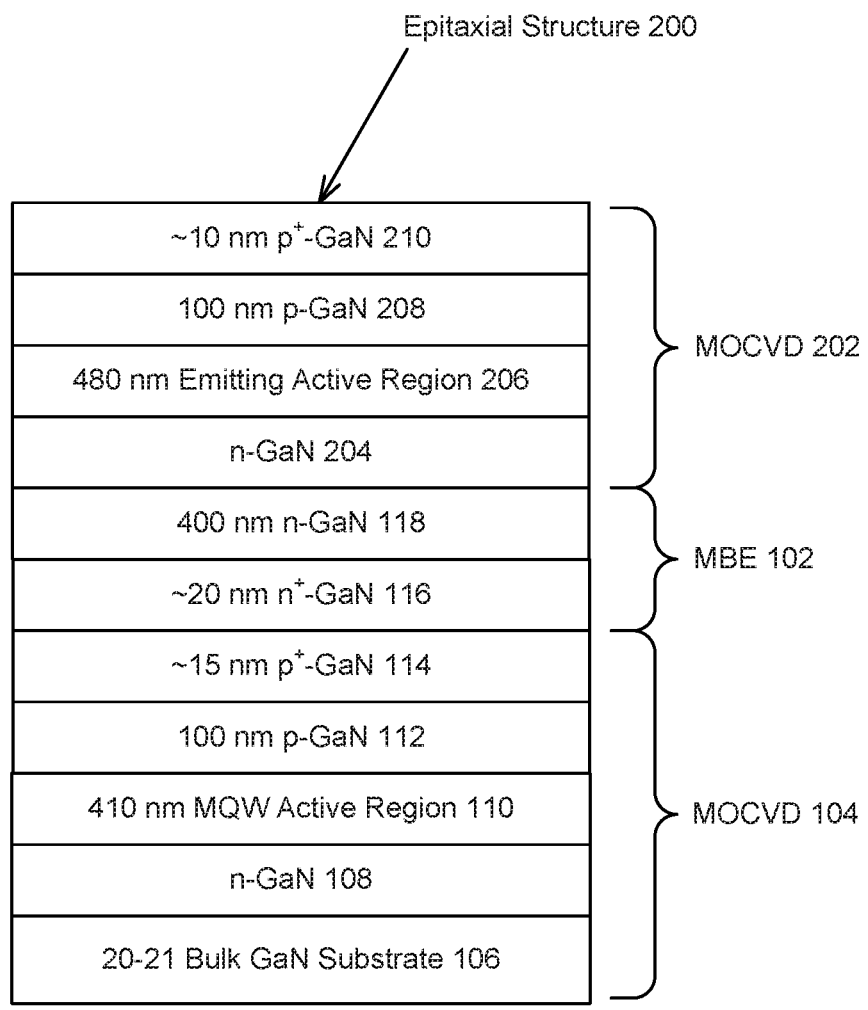
FIG. 2A is a schematic of an epitaxial structure for a double MOVCD LED with an MBE tunnel junction sandwiched therebetween, wherein the layers of the structure are annotated by the MBE or MOCVD growth technique to the right of the layers.

To demonstrate this, the epitaxial structure 100 shown in FIG. 1A was reloaded into the MOCVD reactor, and a 480 nm emitting LED was grown on top of the MBE grown layers, so that both light emitting layers were grown by MOCVD, while the tunnel junction layer was grown by MBE. These double MOCVD grown LED structures with an MBE grown tunnel junction sandwiched therebetween are shown in the schematic of FIG. 2A, wherein the layers of the epitaxial structure 200 are annotated by their respective MOCVD 202, MBE 102 and MOCVD 104 growth technique to the right of the layers 106-118 and 204-210. The 480 nm emitting LED is comprised of an n-GaN layer 204, a 480 nm MQW active region 206, a 100 nm p-GaN layer 208 and a ~10 nm p$^1$-GaN layer 210.

A three contact device was fabricated to allow for contact to both MOCVD n-GaN layers 108, 204 as well as the top p-GaN layer 210. The process started with the deposition of a 2/3 nm Pd/Au layer (not shown), which serves as the p-contact and current spreading layer. A first mesa etch (not shown) was then carried out, which stopped at the top MOCVD n-GaN layer 204. A second mesa etch (not shown) was then done outside the first mesa, which exposed the bottom MOCVD n-GaN layer 108. A 30/500 nm Ti/Au contact (not shown) was deposited, which served three purposes: a large area pad formed a contact to the bottom MOCVD n-GaN layer 108, while a smaller contact was deposited in between where the first and second mesas were etched to allow for contact to the middle MBE n-GaN layer 116 or 118. A probing pad and current spreading strip (not shown) was also deposited on the thin Pd/Au p-contact.

Using this geometry, each device can be contacted individually or in series. The top LED can be operated by probing the top p-contact and the middle n-GaN contact, and the bottom LED can be operated by probing the two n-contacts. Both LEDs can be injected by probing the p-contact and the bottom n-GaN contact.

Figure 2D:
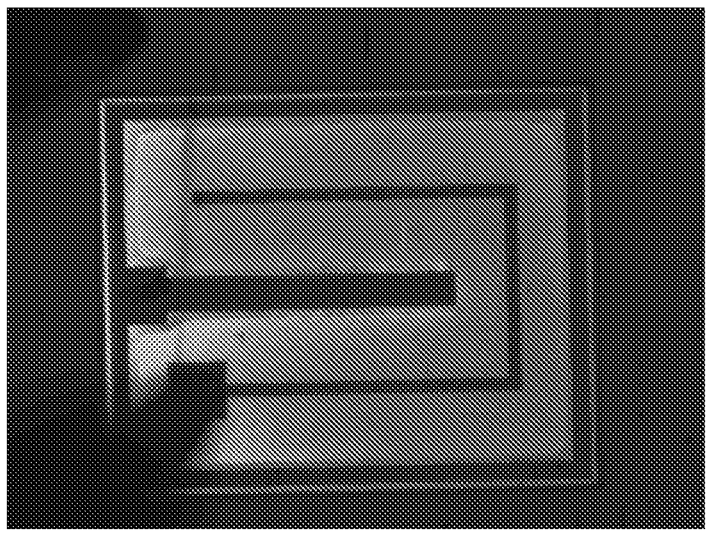
FIG. 2D is an image that shows the device of FIG. 2B operating at 20 mA, wherein the probes were connected to the top p-GaN layer and the bottom n-GaN layer.
Figure 2C:
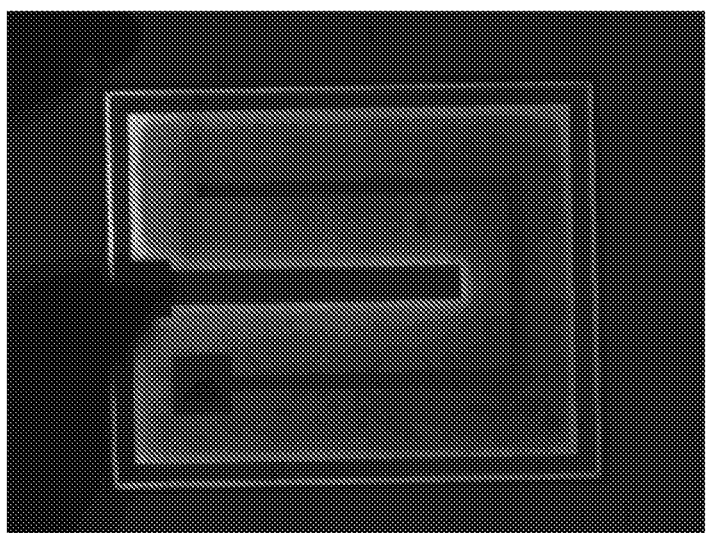
FIG. 2C is an image that shows the device of FIG. 2B operating at 20 mA, wherein the probes were connected to the n-GaN layer between the two active regions and the bottom n-GaN layer and the n-GaN layer is used as a current spreading layer.
Figure 2B:
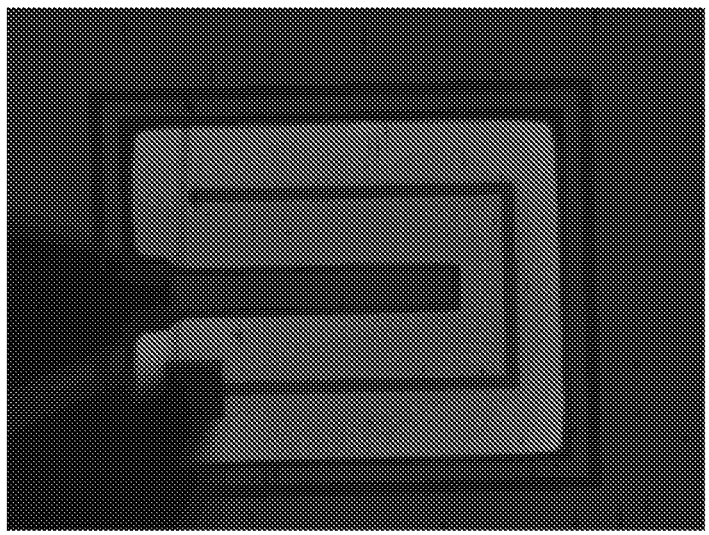
FIG. 2B is an image that shows a three contact device operating at 20 mA, wherein the probes were connected to the p-layer on top of the double LED and the n-GaN between the two light emitting regions and a 2/3 nm Pd/Au layer is used for current spreading.

FIG. 2B is an image that shows a three contact device operating at 20 mA, wherein the probes were connected to the p-layer on top of the double LED and the MBE n-GaN layers 116 or 118 between the two light-emitting regions 110, 206. A 2/3 nm Pd/Au layer is used for current spreading. This operation only injected carriers in the top 480 nm active region 206.

FIG. 2C is an image that shows the device of FIG. 2B operating at 20 mA, wherein the probes were connected to the MBE n-GaN layers 116 or 118 between the two light-emitting regions 110, 206 and the bottom n-GaN layer 108. This operation only injected carriers in the bottom 410 nm active region 110 and utilizes the bottom n-GaN layer 108 as a current spreading layer.

FIG. 2D is an image that shows the device of FIG. 2B operating at 20 mA, wherein the probes were connected to the top p-GaN layer 210 and the bottom n-GaN layer 108. This operation injects carriers into active regions through the use of the tunnel junction.

Figure 2F:
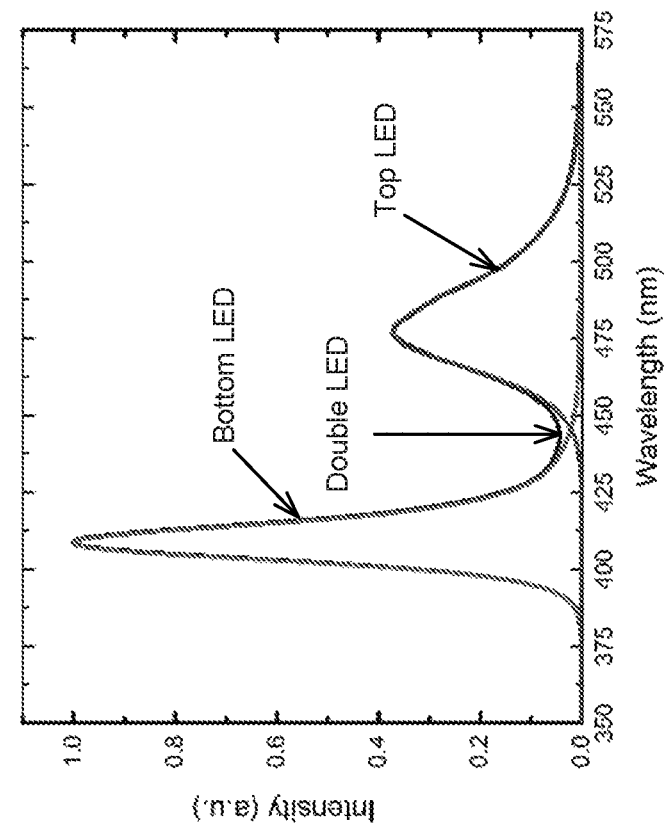
FIG. 2F shows a spectra of the device of FIGS. 2B, 2C and 2D for the three different operating cases at 20 mA.
Figure 2E:
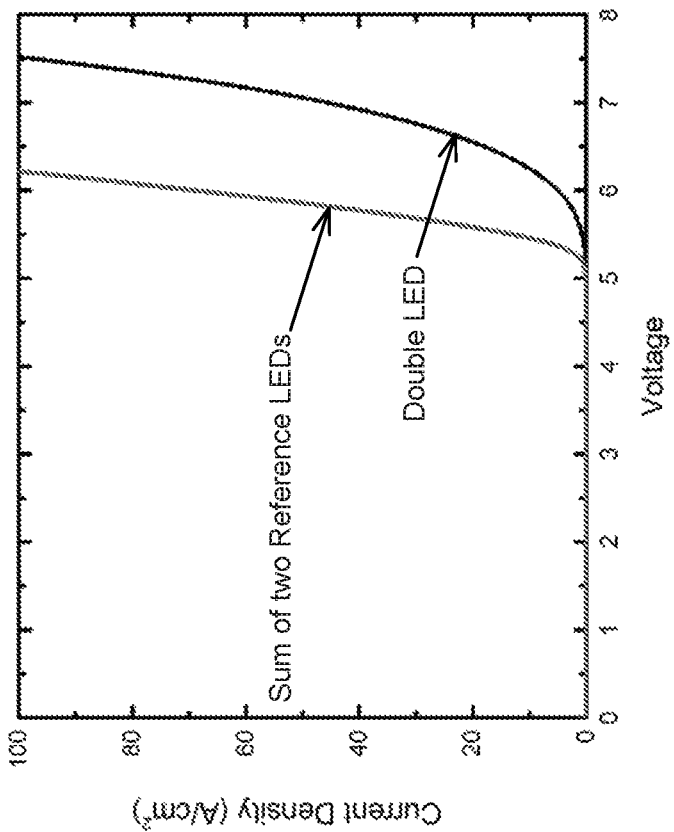
FIG. 2E is a graph of current density vs. voltage that compares the double LED structure with a tunnel junction to two reference LEDs.

To compare the current-voltage (IV) characteristics of the double LED, two reference LEDs with a p-contact were made with the 410 nm active region and the 480 nm active region, respectively. FIG. 2E is a graph of an IV plot for the double LED, as well as the sum of the two reference LEDs, wherein the voltages from the two reference LEDs are added to give the effective voltage of two reference LEDs. The top LED in the double LED structure has an area of 0.1 mm$^2$, while the bottom LED has an area of 0.15 mm$^2$ due to the middle n-contact and alignment tolerances. Spectra for the LEDs in each operating condition are shown in the graph of FIG. 2F.

In addition to the tunnel junction LEDs described above, the present invention can also be applied to VCSELs, which have a long history of prior art dating back to the 1970's. [5,6] III-nitride VCSELs represent a new class of VCSELs that represent a new set of unique challenges and device designs compared to conventional III-arsenide VCSELs. [7,8] The present invention provides a regrowth technique for achieving high quality III-nitride tunnel junction intracavity contacts in III-nitride VCSELs.

In [9,10,11,12,13], various structures for light-emitters employing a tunnel junction are described; however, the details of tunnel junction growth for III-nitride materials are not disclosed. Moreover, no reported III-nitride VCSELs, prior to this invention, have achieved lasing with a tunnel junction. Consequently, the method of regrowing a tunnel junction on MOCVD grown III-nitride epitaxial layers according to this invention provides a number of possible improvements for III-nitride VCSELs.

To demonstrate the improvements possible for nitride VCSELs, an MBE n$^{++}$-GaN tunnel junction was regrown on an MOCVD VCSEL. This structure was processed and compared to a structure with identical MOCVD epitaxy and aperture geometry, but with an ITO intracavity contact.

Figure 3:
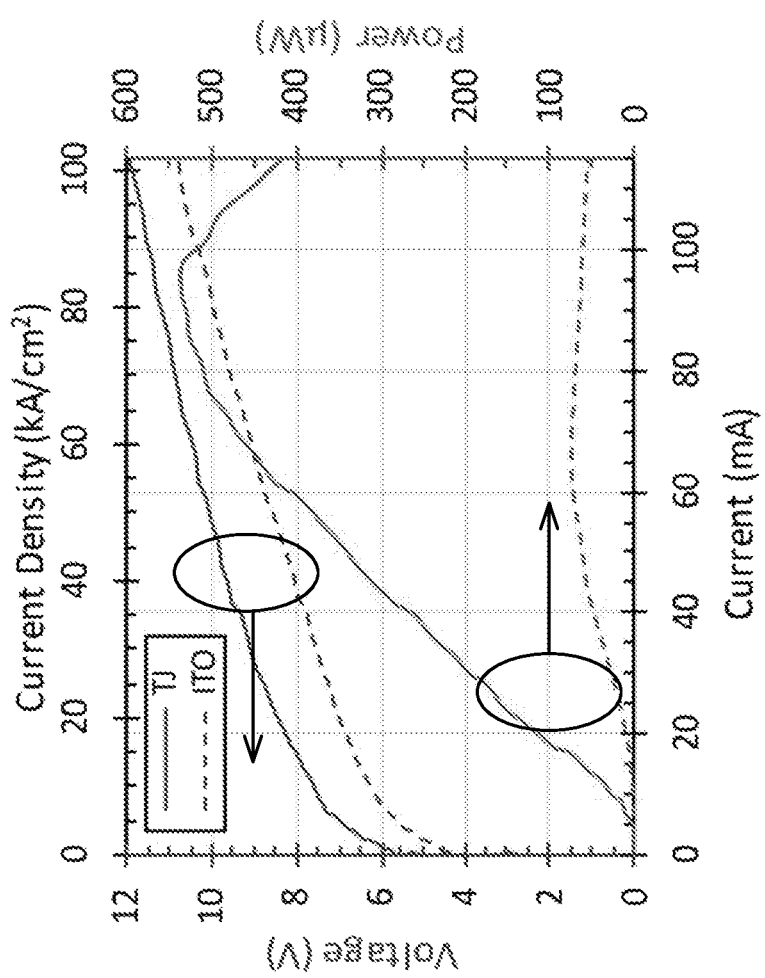
FIG. 3 shows the power-current-voltage (LIV) and power-current density-voltage (LJV) characteristics of a 6.95-λ TJ VCSEL and an ITO VCSEL with 12 μm aperture diameters measured under pulsed operation (0.3% duty cycle, 100 ns pulse width).

FIG. 3 is a graph of the measured LIV and LJV characteristics of a 6.95-λ TJ VCSEL and an ITO VCSEL with 12 μm aperture diameters measured under pulsed operation (0.3% duty cycle, 100 ns pulse width). The TJ VCSEL shows a reduced threshold current density (3.5 kA/cm$^2$) as compared with the threshold current density of the ITO VCSEL (8 kA/cm$^2$), and a significant improvement (5×) in peak output power due to the reduction in internal losses. The TJ VCSEL also shows significantly higher differential efficiency due to the large reduction in internal loss.

FIGS. 4, 5A-5C, 6A-6B and 7 are schematics that show possible epitaxial structures, growth methods and repeat sequences, wherein one or more regrown MBE tunnel junctions are used in a VCSEL laser structure.

Figure 4:
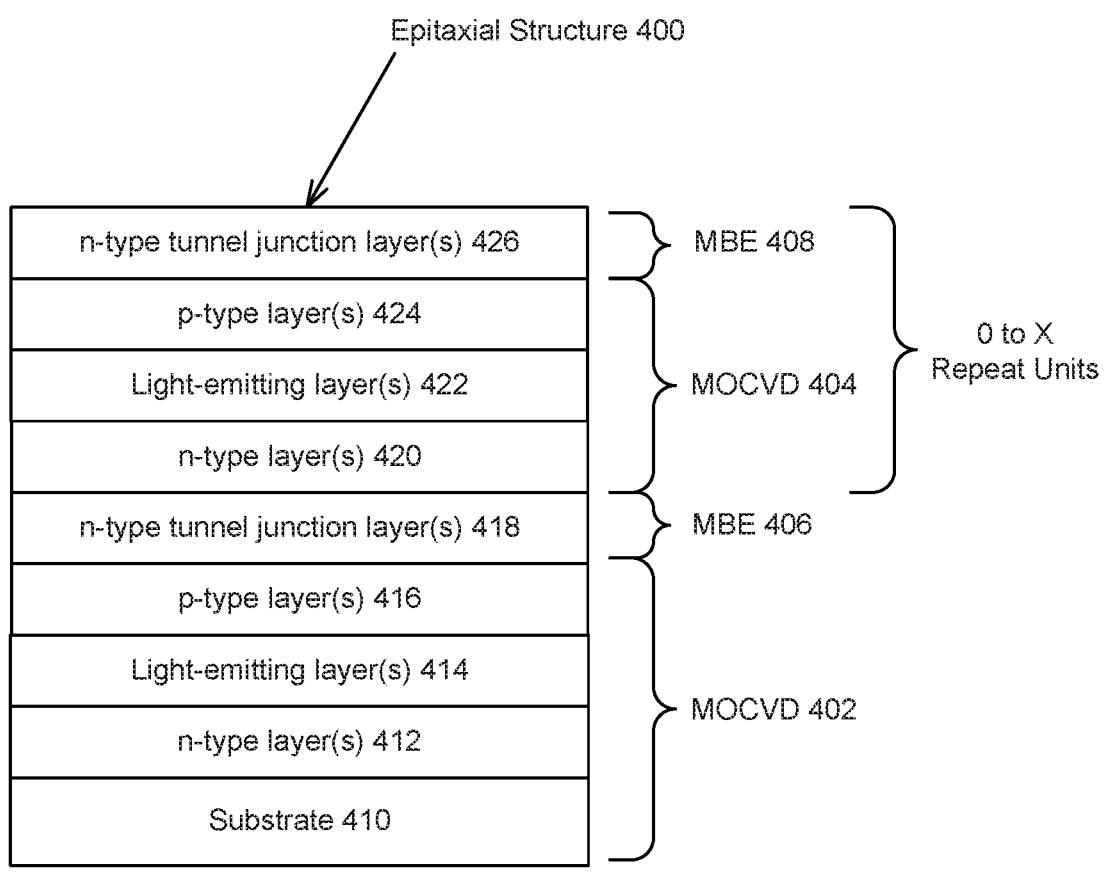
FIG. 4 is a schematic of an epitaxial structure for a VCSEL employing MBE grown tunnel junction intracavity contacts, wherein the III-nitride layer types of the structure are annotated by the MBE or MOCVD growth method and repeat sequence to the right of the layers.

FIG. 4 includes a schematic of an epitaxial structure for a VCSEL 400 employing MBE grown tunnel junction intracavity contacts, wherein the III-nitride layer types of the structure are annotated by their respective MOCVD 402, 404 or MBE 406, 408 growth methods and repeat units to the right of the layers 410-426.

In this design, the VCSEL 400 includes a substrate 410, followed by n-type layers(s) 412, light-emitting layer(s) 414, and p-type layer(s) 416 grown by MOCVD 402, which are followed by n-type tunnel junction layer(s) 418 grown by MBE 406, which are followed by n-type layers(s) 420, light-emitting layer(s) 422, and p-type layer(s) 424 grown by MOCVD 404, which are followed by n-type tunnel junction layer(s) 426 grown by MBE 408. The final MOCVD 404 and MBE 408 steps may be repeated as a unit 0 to X times.

The order of the epitaxial layers shown in the design of FIG. 4 makes the structure 400 appropriate for fabricating a flip-chip VCSEL using laser lift-off of the native substrate and dielectric layers for the n-side and p-side distributed Bragg reflectors (DBRs) (i.e., dual dielectric DBRs). By growing the repeat units shown, a device can be made with a cascade of active regions aligned to peaks of the cavity mode in the finished device.

Figure 5A:
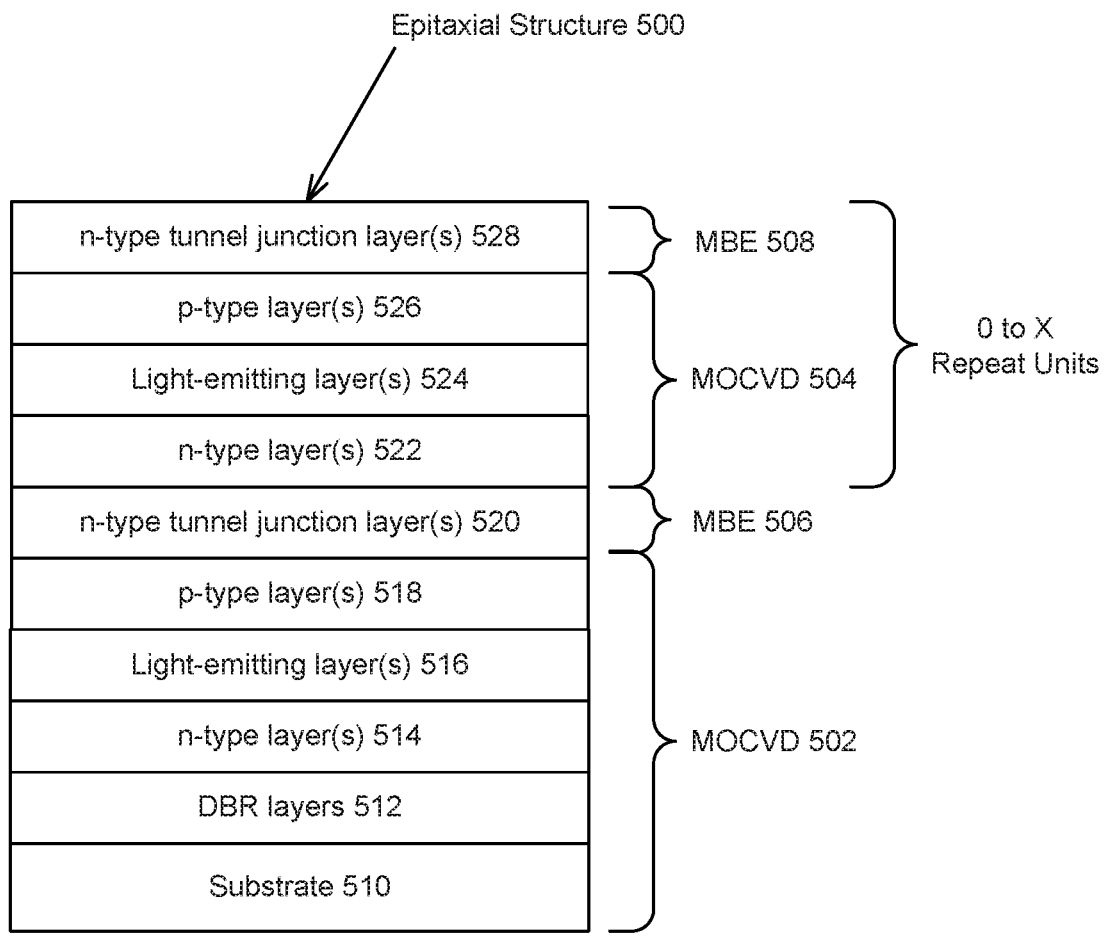
FIGS. 5A-5C are schematics of an epitaxial structure for the VCSEL employing MBE grown tunnel junction intracavity contacts, illustrating variations in the epitaxial structures and processing steps, wherein the III-nitride layer types of the structure are annotated by the MBE or MOCVD growth method and repeat sequence to the right of the layers.
Figure 5B:
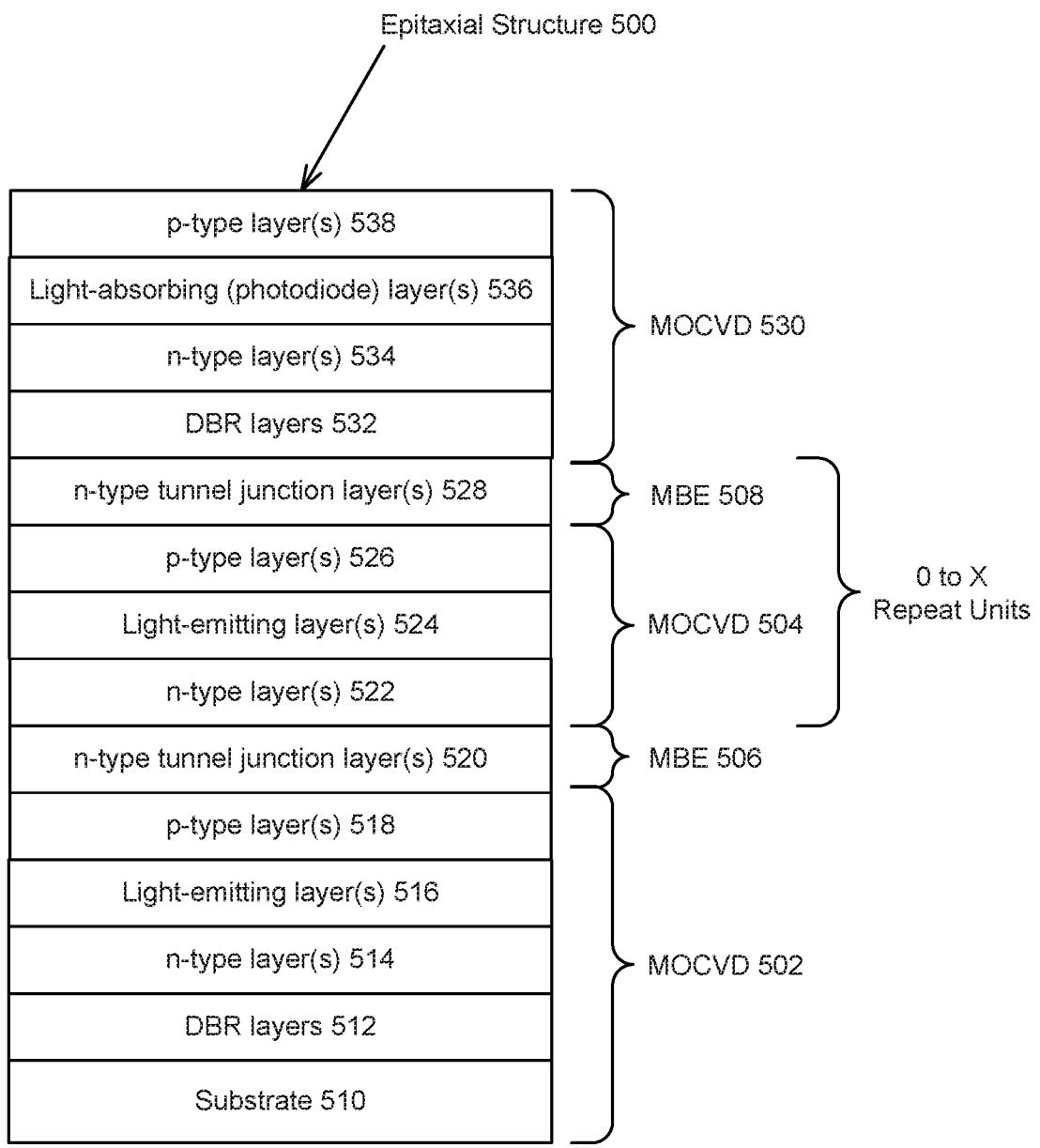
Figure 5C:
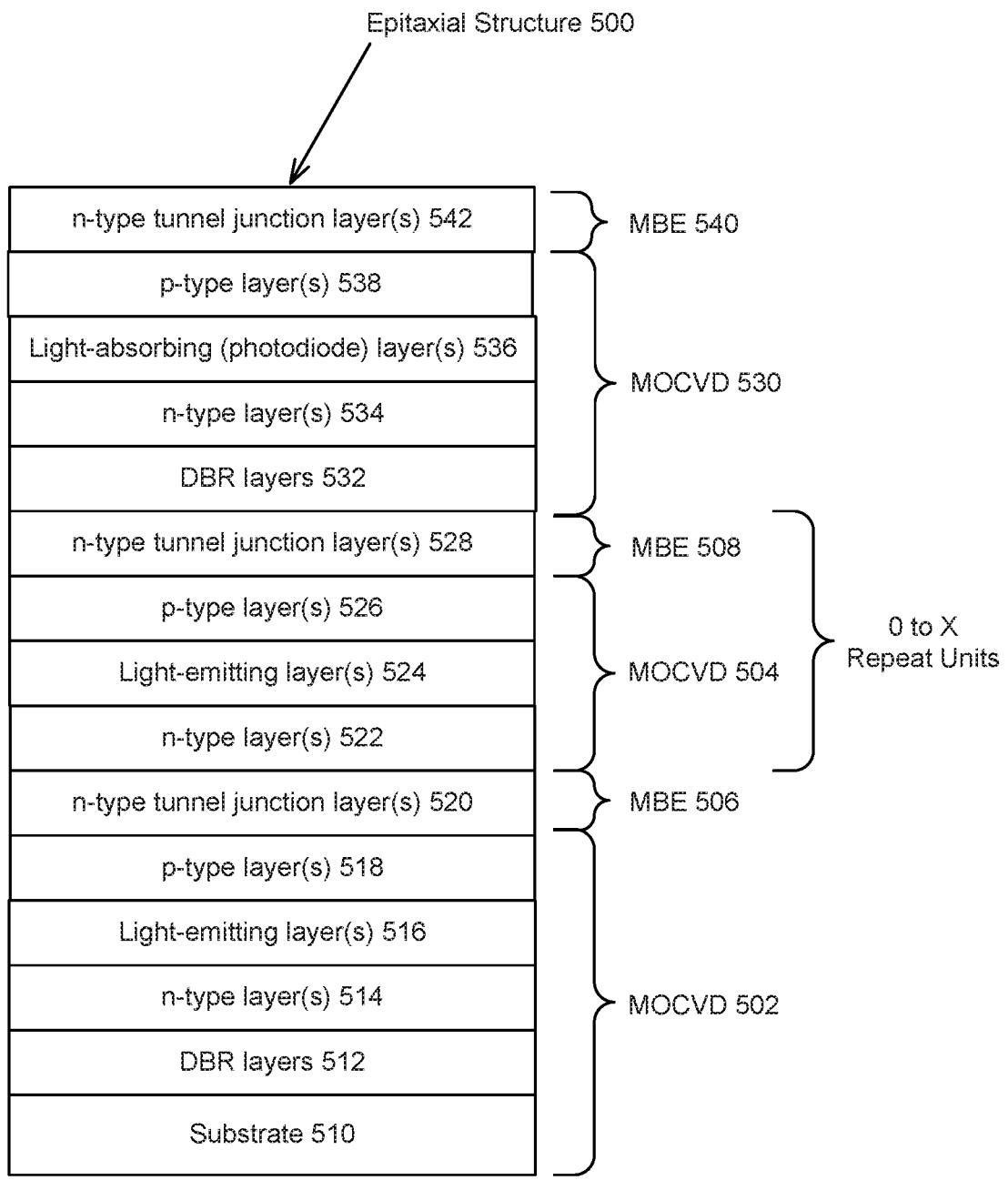

FIGS. 5A-5C includes schematics of epitaxial structures for VCSELs employing MBE grown tunnel junction intracavity contacts, illustrating variations in the epitaxial structures and processing steps.

FIG. 5A includes a schematic of an epitaxial structure 500 for a VCSEL employing MBE grown tunnel junction intracavity contacts, wherein the III-nitride layer types of the structure are annotated by their respective MOCVD 502, 504 or MBE 506, 508 growth methods and repeat units to the right of the layers 510-528. The VCSEL 500 includes a substrate 510, followed by DBR layers 512, n-type layers(s) 514, light-emitting layer(s) 516, and p-type layer(s) 518 grown by MOCVD 502, which are followed by n-type tunnel junction layer(s) 520 grown by MBE 506, which are followed by n-type layers(s) 522, light-emitting layer(s) 524, and p-type layer(s) 526 grown by MOCVD 504, which are followed by n-type tunnel junction layer(s) 528 grown by MBE 508. The second MOCVD 504 and second MBE 508 steps may be repeated as a unit 0 to X times.

In FIG. 5B, the epitaxial structure 500 of FIG. 5A is modified by the MOCVD 530 growth of DBR layers 532, n-type layers(s) 534, light-absorbing (photodiode) layer(s) 536, and p-type layer(s) 538.

In FIG. 5C, the epitaxial structure 500 of FIG. 5B is modified by the MBE 540 growth of n-type tunnel junction layer(s) 542.

Figure 6A:
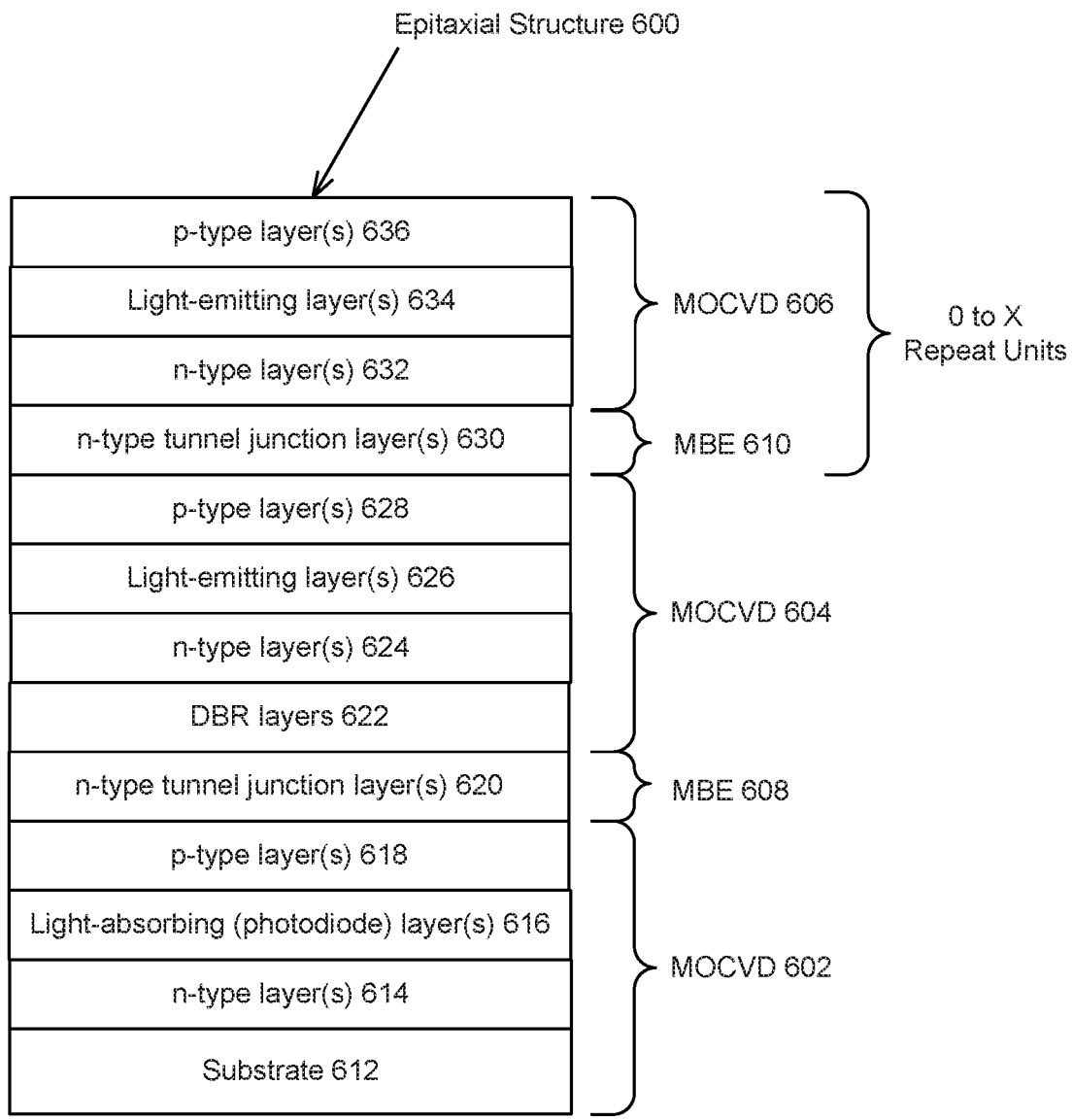
FIGS. 6A-6B are schematics of an epitaxial structure for the VCSEL employing MBE grown tunnel junction intracavity contacts, illustrating variations in the epitaxial structures and processing steps, wherein the III-nitride layer types of the structure are annotated by the MBE or MOCVD growth method and repeat sequence to the right of the layers.
Figure 6B:
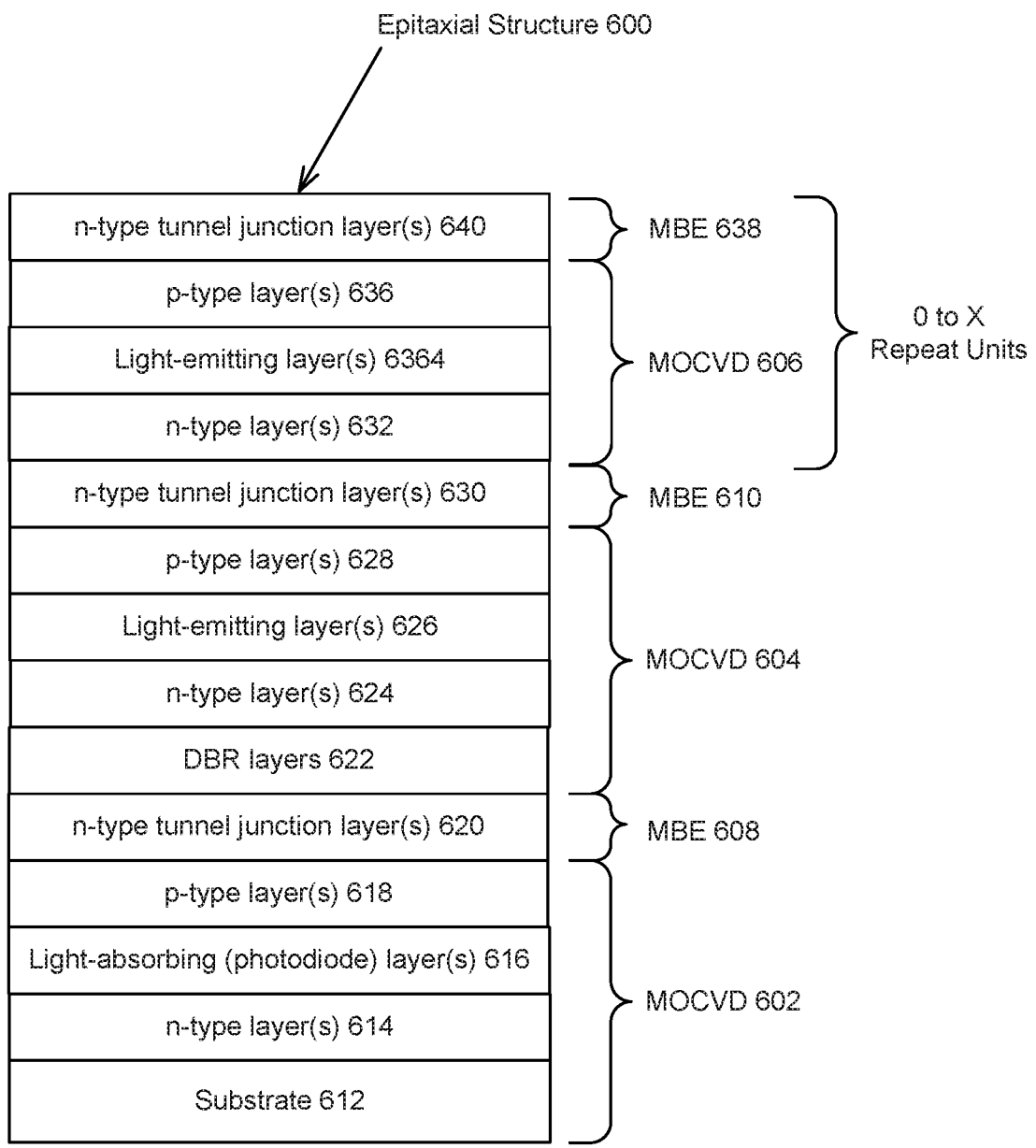

FIGS. 6A and 6B are schematics of an epitaxial structure 600 for a VCSEL employing MBE grown tunnel junction intracavity contacts, illustrating a variation in the epitaxial structure and processing steps.

FIG. 6A includes a schematic of an epitaxial structure 600 for a VCSEL employing MBE grown tunnel junction intracavity contacts, wherein the III-nitride layer types of the structure are annotated by their respective MOCVD 602, 604, 606 or MBE 608, 610 growth methods and repeat units to the right of the layers 612-636. The VCSEL 600 includes a substrate 612, followed by n-type layers(s) 614, light-absorbing (photodiode) layer(s) 616, and p-type layer(s) 618 grown by MOCVD 602, which are followed by n-type tunnel junction layer(s) 620 grown by MBE 608, which are followed by DBR layer(s) 622, n-type layers(s) 624, light-emitting layer(s) 626, and p-type layer(s) 628 grown by MOCVD 604, which are followed by n-type tunnel junction layer(s) 630 grown by MBE 610, which are followed by n-type layers(s) 632, light-emitting layer(s) 634, and p-type layer(s) 636 grown by MOCVD 606. The third MOCVD 606 and second MBE 610 steps may be repeated as a unit 0 to X times.

In FIG. 6B, the epitaxial structure 600 of FIG. 6A is modified by the MBE 638 growth of n-type tunnel junction layer(s) 640. The third MOCVD 606 and third MBE 638 steps may be repeated as a unit 0 to X times.

The order of the epitaxial layers shown in these designs makes these structures appropriate for fabricating VCSELs employing epitaxially grown DBRs on the p-side and n-side (dual epitaxial DBRs) or an epitaxial DBR on the n-side and a dielectric DBR on the p-side (hybrid DBRs). Only the layers that comprise the epitaxial growth process are shown (i.e. no dielectric or metal layers are shown). All of the designs show that one could make a cascade of active regions by increasing the identified repeat unit: FIG. 5A shows an epitaxial structure 500 for a VCSEL employing a hybrid DBR design; FIG. 5B shows an epitaxial structure 500 for a dual epitaxial DBR VCSEL with a light-absorbing layer that may act to monitor the emitted power from the light-emitting region(s), wherein the structure does not include a tunnel-junction cap; FIG. 5C shows the same epitaxial structure 500 as FIG. 5B, except that a tunnel junction cap is included; and FIGS. 6A and 6B show epitaxial structures 600 similar to the epitaxial structures 500 of FIGS. 5B and 5C, respectively, except that the light-absorbing (photodiode) layer is grown before the light-emitting layers.

Figure 7:
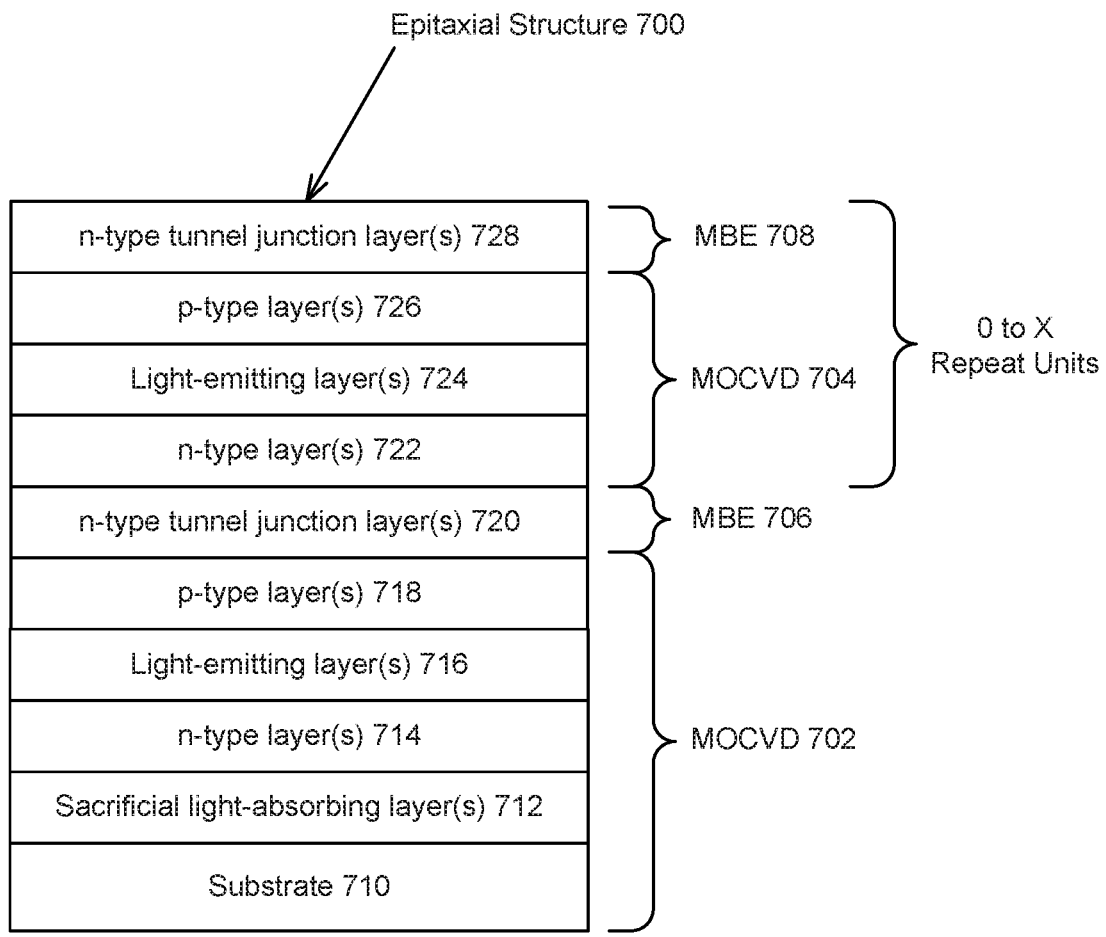
FIG. 7 is a schematic of an epitaxial structure for a VCSEL employing MBE grown tunnel junction intracavity contacts, wherein the III-nitride layer types of the structure are annotated by the MBE or MOCVD growth method and repeat sequence to the right of the layers.

FIG. 7 is a schematic of an epitaxial structure 700 for a VCSEL employing MBE grown tunnel junction intracavity contacts, wherein the III-nitride layer types of the structure are annotated by their respective MOCVD 702, 704 or MBE 706, 708 growth methods and repeat units to the right of the layers 710-728.

In FIG. 7, the VCSEL includes a substrate 710, followed by sacrificial light-absorbing layer(s) 712, n-type layers(s) 714, light-emitting layer(s) 716, and p-type layer(s) 718 grown by MOCVD 702, which are followed by n-type tunnel junction layer(s) 720 grown by MBE 706, which are followed by n-type layers(s) 722, light-emitting layer(s) 724, and p-type layer(s) 726 grown by MOCVD 704, which are followed by n-type tunnel junction layer(s) 728 grown by MBE 708. The second MOCVD 704 and second MBE 708 steps may be repeated as a unit 0 to X times.

The order of the epitaxial layers shown in FIG. 7 makes the structure 700 appropriate for fabricating a flip-chip dual dielectric DBR VCSEL using photoelectrochemical (PEC) etching to remove the native substrate. The sacrificial light-absorbing layer(s) is removed during a photoelectrochemical etching process.

Fabrication Process

Figure 8:
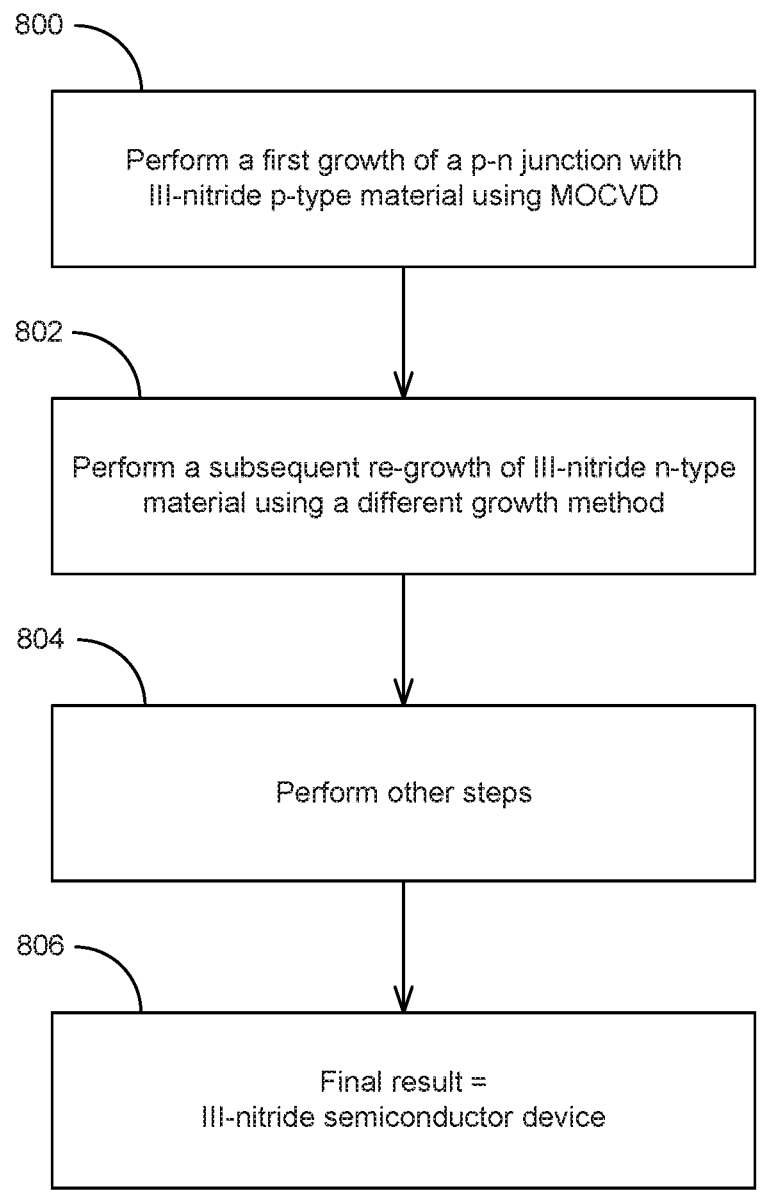
FIG. 8 is a flowchart that illustrates a method for fabricating a III-nitride based semiconductor device, according to one embodiment.

FIG. 8 is a flowchart that illustrates a method for fabricating a III-nitride based semiconductor device, according to one embodiment.

Block 800 represents the step of performing a first growth of a p-n junction with III-nitride based p-type material using MOCVD.

Block 802 represents the step of performing a subsequent regrowth of III-nitride based n-type material using a different growth technique than MOCVD.

For example, the subsequent regrowth may be performed using ammonia-assisted or plasma-assisted MBE. Specifically, the subsequent regrowth is performed under conditions that prevent passivation of the III-nitride based p-type material.

In Block 802, the subsequent regrowth forms a tunnel junction. In this regard, one or more of the following alternatives are possible:

The III-nitride based p-type material and the tunnel junction are grown by the different growth technique than MOCVD.

The subsequent regrowth is of highly doped p-type material to reduce contact resistance, and the subsequent regrowth ends with the III-nitride based n-type material, allowing for buried activated p-type layers to be grown.

The tunnel junction is formed at a regrowth interface, wherein delta-doping is used at the regrowth interface.

The method further comprises performing another growth, after the subsequent regrowth, of a regrown active region using MOCVD, with or without another set of n-type and/or p-type layers.

The first growth is an LED and the regrown active region is a second LED of the same or similar emission wavelength, such that efficiency droop is reduced through use of multiple active regions.

Layers grown by performing another growth are of the same or similar wavelengths and are aligned to peaks of a cavity mode in a VCSEL, such that each active region has large enhancement factors.

The first growth is a III-nitride optoelectronic device, and the regrown active region is a longer wavelength single or multiple quantum well structure that is optically pumped by emission of shorter wavelength from the first growth, wherein the longer wavelength single or multiple quantum well structure is a photodiode used to monitor the emission of shorter wavelength from the first growth or regrown active region.

The regrown active region is a III-nitride optoelectronic device, and the first growth is a longer wavelength single or multiple quantum well structure that is optically pumped by emission of shorter wavelength from the regrown active region, wherein the longer wavelength single or multiple quantum well structure is a photodiode used to monitor the emission of shorter wavelength from the first growth or regrown active region.

The first growth is an LED, and the regrown active region is an LED of a different emission wavelength.

The device is a III-nitride optoelectronic device and a top n-type layer of the tunnel junction serves as a current spreading layer.

The device is a III-nitride optoelectronic device, and multiple embedded tunnel junctions therein are used to screen or enhance polarization fields in active regions.

The device is a III-nitride optoelectronic device, and the tunnel junction allows for use of a thin p-type material to reduce electrical and optical losses in the III-nitride based p-type material.

The device is an LED, and sheet resistance on both sides of the p-n junction is matched to reduce current crowding.

The device is an LED, and top and bottom III-nitride layers of the LED are roughened to increase an extraction efficiency of the LED.

The device is a VCSEL processed in a flip-chip geometry with one or more high reflectivity optical coatings to enhance light extraction or confine an optical mode in the VCSEL.

The device is a multi junction solar cell or photodiode.

A single metal contact deposition is used to fabricate contacts to n-type layers of the device.

A top III-nitride layer of the tunnel junction eliminates the need for a p-contact grid.

Each buried III-nitride layer is contacted, such that current flowing through each active region is controlled individually.

Block 804 represents other steps being performed, which may include the repeating of units for 0 to X times, as described above.

Block 806 represents the final result of the method, namely a III-nitride based semiconductor device fabricated by the method, and comprising: one or more light-emitting or light-absorbing structures grown by MOCVD, wherein the light-emitting or light-absorbing structures include one or more p-type III-nitride layers; and one or more tunnel junctions grown by ammonia or plasma-assisted MBE on the light-emitting or light-absorbing structures, wherein the tunnel junctions include one or more n-type III-nitride layers that are grown on the p-type III-nitride layers of the light-emitting or light-absorbing structures, and a regrowth interface between the p-type III-nitride layers and the n-type III-nitride layers serves as a p-n interface in the tunnel junction.

REFERENCES

The following publications, referenced above are relevant to this disclosure:

[1] L. Esaki, Physical Review 109, (1958).

[2] J. Simon et al. Science 327 (5961): 60-64.

[3] S. Krishnamoorthy et al., Appl. Phys. Lett. 105, 141104 (2014).

[4] S. Krishnamoorthy et al., Nano Lett. 13, 2570-2575 (2013).

[5] K. Iga, "Surface-Emitting Laser—Its Birth and Generation of New Optoelectronics Field," IEEE J. Sel. Top. Quantum Electron., Vol. 6, No. 6, pp. 1201-1215, 2000.

[6] K. Iga, "Vertical-cavity surface-emitting laser: Its conception and evolution," Jpn. J. Appl. Phys., Vol. 47, pp. 1-10, 2008.

[7] D. Feezell, "The Evolving GaN VCSEL," Compound Semiconductor, pp. 1-10, 2014.

[8] D. F. Feezell, "Status and future of GaN-based vertical-cavity surface-emitting lasers," Proc. SPIE, Vol. 9363, pp. 93631G-1-13, 2015.

[9] U.S. Pat. No. 6,515,308, issued Feb. 4, 2003, to Kneissl et al., and entitled "Nitride-based VCSEL or Light Emitting Diode With P-N Tunnel Junction Current Injection."

[10] U.S. Pat. No. 7,123,638, issued Oct. 17, 2006, to Leary et al., and entitled "Tunnel-Junction Structure Incorporating N-type Layer Comprising Nitrogen and a Group VI Dopant."

[11] EP Publication No. 1,403,935, published Apr. 21, 2010, by Collins et al., and entitled "Light Emitting Devices Including Tunnel Junctions."

[12] U.S. Pat. No. 6,724,013, issued Apr. 20, 2004, to Kneissl et al., and entitled "Edge-Emitting Nitride-Based Laser Diode with P-N Tunnel Junction Current Injection."

[13] U.S. Pat. No. 6,760,357, issued Jul. 6, 2004, to Boucart et al., and entitled "Vertical Cavity Apparatus With Tunnel Junction."

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for fabricating a III-nitride based semiconductor device, comprising:

performing a first growth of a III-nitride based p-n junction structure comprised of III-nitride based p-type material and III-nitride based n-type material, by growing the III-nitride based p-type material using metal-organic chemical vapor deposition (MOCVD); and performing a subsequent regrowth of the III-nitride based p-n junction structure, by regrowing the III-nitride based n-type material on the III-nitride based p-type material using a different growth technique than MOCVD, wherein a tunnel junction is formed at an interface between the III-nitride based p-type material grown by MOVCD and the III-nitride based n-type material regrown using the different growth technique than MOCVD.

2. The method of claim 1 where the subsequent regrowth is performed under conditions that prevent passivation of the III-nitride based p-type material.

3. The method of claim 1, wherein the subsequent regrowth of the III-nitride based p-type material is highly doped to reduce contact resistance.

4. The method of claim 1, wherein the subsequent regrowth ends with the III-nitride based n-type material, allowing for buried activated III-nitride based p-type layers to be grown.

5. The method of claim 1, wherein delta-doping is used at the regrowth interface.

6. The method of claim 1, further comprising performing another growth, after the subsequent regrowth, of a regrown active region using MOCVD.

7. The method of claim 6, wherein the first growth is a light-emitting diode (LED) and the regrown active region is a second LED of similar emission wavelength, such that efficiency droop is reduced through use of multiple active regions.

8. The method of claim 6, wherein layers grown by performing another growth are of similar wavelengths and are aligned to peaks of a cavity mode in a vertical-cavity surface-emitting laser (VCSEL), such that each active region has large enhancement factors.

9. The method of claim 6, wherein the first growth is a III-nitride optoelectronic device, and the regrown active region is a longer wavelength single or multiple quantum well structure that is optically pumped by emission of shorter wavelength from the first growth.

10. The method of claim 9, wherein the longer wavelength single or multiple quantum well structure is a photodiode used to monitor the emission of shorter wavelength from the first growth or regrown active region.

11. The method of claim 6, wherein the regrown active region is a III-nitride optoelectronic device, and the first growth is a longer wavelength single or multiple quantum well structure that is optically pumped by emission of shorter wavelength from the regrown active region.

12. The method of claim 11, wherein the longer wavelength single or multiple quantum well structure is a photodiode used to monitor the emission of shorter wavelength from the first growth or regrown active region.

13. The method of claim 6, wherein the first growth is a light-emitting diode (LED), and the regrown active region is an LED of a different emission wavelength.

14. The method of claim 1, wherein the device is a III-nitride optoelectronic device and a top n-type layer of the tunnel junction serves as a current spreading layer.

15. The method of claim 1, wherein the device is a III-nitride optoelectronic device, and the tunnel junction is used to screen or enhance polarization fields in active regions.

16. The method of claim 1, wherein the device is a III-nitride optoelectronic device, and the tunnel junction allows for use of a thin p-type material to reduce electrical and optical losses in the III-nitride based p-type material.

17. The method of claim 1, wherein the device is a light-emitting diode (LED), and sheet resistance on both sides of the III-nitride based p-n junction structure is matched to reduce current crowding.

18. The method of claim 1, wherein a single metal contact deposition is used to fabricate contacts to III-nitride based n-type layers of the device.

19. The method of claim 1, wherein the subsequent regrowth is performed using ammonia-assisted or plasma-assisted molecular beam epitaxy (MBE).

20. A III-nitride based semiconductor device fabricated by the method of claim 1.

* * * * *